United States Patent
Xiang et al.

(10) Patent No.: US 7,526,696 B2
(45) Date of Patent: Apr. 28, 2009

(54) SCAN-BASED SELF-TEST STRUCTURE AND METHOD USING WEIGHTED SCAN-ENABLE SIGNALS

(75) Inventors: Dong Xiang, Beijing (CN); Jiaguang Sun, Beijing (CN); Mingjing Chen, Beijing (CN)

(73) Assignee: Tsinghua University, Beijing (CN)

( * ) Notice: Subject to any disclaimer, the term of this patent is extended or adjusted under 35 U.S.C. 154(b) by 300 days.

(21) Appl. No.: 11/368,015

(22) Filed: Mar. 3, 2006

(65) Prior Publication Data
US 2006/0236182 A1 Oct. 19, 2006

(30) Foreign Application Priority Data
Mar. 4, 2005 (CN) .................... 2005 1 0011382

(51) Int. Cl.
*G01R 31/28* (2006.01)
(52) U.S. Cl. .................... 714/726; 714/728
(58) Field of Classification Search ............. 714/726, 714/729
See application file for complete search history.

(56) References Cited

U.S. PATENT DOCUMENTS

| | | | | |
|---|---|---|---|---|
| 5,612,963 A | * | 3/1997 | Koenemann et al. | 714/739 |
| 6,671,838 B1 | * | 12/2003 | Koprowski et al. | 714/726 |
| 6,795,948 B2 | * | 9/2004 | Lin et al. | 716/1 |
| 7,197,721 B2 | * | 3/2007 | Patil et al. | 716/1 |
| 2005/0039093 A1 | * | 2/2005 | Bailliet et al. | 714/726 |

OTHER PUBLICATIONS

Dong Xiang, Mingjing Chen, Hideo Fujiwara, Using Weighted Scan Enable Signals to Improve the Effectiveness of Scan-Based BIST, Proceedings of the 14th Asian Test Symposium (ATS Dec. 2005), IEEE Computer Society, China.

* cited by examiner

*Primary Examiner*—Cynthia Britt
*Assistant Examiner*—Steve Nguyen
(74) *Attorney, Agent, or Firm*—Michael Best & Friedrich LLP

(57) ABSTRACT

A scan-based self-test architecture and method using weighted scan enable signals is disclosed. The self-test architecture comprises: a linear feedback shift register; a phase shifter connected to outputs of the linear feedback shift register, and scan chains and the combinational part of the circuit under test; an AND gate; scan chains, each being formed by serially connecting multiple scan flip-flops having the same architecture; a multiplexer; and a logic unit for generating weighted random signal, whose inputs are connected with the phase shifter; the logic unit randomly selects the input pseudo random signals, weights the selected pseudo random signals, and assigns the weighted pseudo random signals assigned to the scan enable signals of the scan chains, to control the switching of the scan chains between the scan shift mode and the functional mode. The test effectiveness of scan-based BIST can be improved greatly using the test scheme with weighted scan enable signals.

2 Claims, 3 Drawing Sheets

SCAN-BASED SELF-TEST STRUCTURE AND METHOD USING WEIGHTED SCAN-ENABLE SIGNALS

This application claims priority under 35 U.S.C. § 119 to Chinese Patent Application No. 200510011382.9, filed on Mar. 4, 2005.

FIELD OF THE INVENTION

The present invention relates to test technique of integrated circuit and, more particularly to scan-based self-test structure and scheme using weighted scan-enable signals.

BACKGROUND OF THE INVENTION

The scan-based self-test technique (scan-based BIST) is a design technique for enhanced testability of synchronous circuits, which combines the traditional built-in self-test technique with the scan design technique to enhance the test effectiveness of digital systems. In the built-in self-test technique, a pseudo-random test pattern generator and a test response compressing logic are embedded into the circuit, where a phase shifter (PS) is also added to reduce the interdependence test signals generated by separate stages of the pseudo-random test pattern generator. The new invention is an effective means to reduce testing time and testing cost of the chips. The scan design makes flip-flops in the circuit controllable and observable and connects these scan flip-flops to form one or more scan chains. Once a fill scan method is used, test pattern generation of the synchronous sequential circuit becomes test pattern generation of the combinational circuit, thus cost of test pattern generation can be reduced greatly, and complete fault coverage can be achieved. The scan design is, therefore, the most popular testability design method used in the field.

Scan-based self-test is usually classified into two classes: test-per-clock BIST and test-per-scan BIST. In the test-per-clock mode, application of a test vector and test response compression are completed in one clock, and testing time required by such self-test structure is relatively short, but hardware overhead required to implement it is very high; as for the test-per-scan BIST, a test vector under is applied into the scan chains through the phase shifter (all scan flip-flops in a scan chain is controlled by the same scan enable signals, wherein it is 1 during the scan shift mode, and 0 for the capture cycle for all scan flip-flops to receive test responses). The circuit is turned to the functional mode after a test vector has been shifted into the scan chain while the test vector corresponding to the primary inputs is applied to the circuit, test responses are captured by the scan flip-flops and received at the primary outputs by the multiple input signature analyzer (MISR). Then the circuit turns to the test mode again; the response information in the scan chain is shifted out to a multi-input signature analyzer (MISR), while next test vector is applied into the scan chain. The hardware overhead of such self-test structure can be reduced, but the test time required increases linearly corresponding to the length of the scan chain. FIG. 1 shows a block diagram of the architecture of the test-per-scan self-test technique.

As shown in FIG. 1, a linear feedback shift register (LFSR) and a phase shifter (PS) are used to generate pseudo-random test vectors, SC is a scan chain, which is constructed by connecting scan flip-flops in the circuit. CP represents control points, and OP represents observation points. The function of the multiple input signature analyzer (MISR) is to collect and compress the test responses. The outputs of the pseudo-random test generator (LFSR) connects with the phase shifter (PS), where outputs of the phase shifter drives the scan chains and primary inputs of the circuit. And finally the test responses are collected and compressed by the multi-input signature analyzer.

In the test-per-scan mode, a scan cycle refers to the clock cycles to apply a test vector into (or shifting out the test responses from) a scan chain, during which the circuit is in the test state. A capture cycle refers to the time required for collecting test responses, during which the circuit is set to the normal operation state. One test period comprises one scan period and one capture period. Generally, for a signal line l, the i controllability $C_i(l)$ ($i \in \{0,1\}$ is defined as the probability that value i is assigned to a signal line l by a randomly selected input vector; and the observability $O(l)$ is defined as the probability for the value on the signal line l to be propagated to a primary output or the scan output by randomly selecting an input vector.

The duration of random self-test is closely relevant to the number of hard-to-test faults. Many techniques have been proposed to solve this problem: (1) weighted random testing, (2) test points insertion, (3) improved pseudo-random test pattern generators, and (4) new scan architecture.

Traditional weighted random test refers to applying weighted random signal having different signal probabilities (probabilities of the value of signal being 1) as the test vector, to reduce the time required for achieving a predetermined fault coverage. Many research results have been achieved on this technique. Bardell, Mc Anney and Savir have proposed a backtracing algorithm for calculating the weights of the primary inputs and outputs of the circuit. Calculation of this method is very simple. Pomeranz and Reddy proposed a method for generating weighted random test pattern, which can increase fault coverage. Recently, Tsai, Cheng and Bhawmilk introduced a scan-based BIST method with multiple capture cycles for each test cycle, which can improve the test effectiveness effectively.

SUMMARY OF THE INVENTION

The present invention provides a scan-based self-test structure using weighted scan-enable signals, comprising:
a linear feedback shift register;
a phase shifter, including: a plurality of input terminals for receiving corresponding output signals of said linear feedback shift registers, and a plurality of output terminals with pseudo random test vector signals to drive scan chains and the primary inputs of the circuit under test, respectively;
multiple AND gates (the number of AND gates is equal to the number of scan chains), wherein one input signal of each AND gate of said unit is a common signal test for switching between a test mode and a normal operation mode, another input signal of each AND gate is a weighted random signal;
a plurality of scan chains, each of the scan chains is formed by serially connecting a number of scan flip-flops, where each of the scan flip-flops is formed by a D flip-flop and a multiplexer;
a multiplexer comprising three signal input terminals, the scan enable signal, an from the combinational circuit, and an input from the predecessor in the scan chain (the first scan flip-flop of a scan chain is driven by an output of the phase shifter);
a multiple input signature analyzer, are connected to the primary outputs terminal of the combinational portion of the circuit under test, an observation points (if inserted), and the scan-out signals from the last scan flip-flop of the scan chains; and very simple logic to generate weighted random signals, whose inputs are uniform pseudo random signals from the phase shifter; wherein said logic unit randomly selects the inputted pseudo random signals, the selected weighted pseudo random signals are connected to the scan-enable signals of the scan chains in order to control switching of the scan chains between the scan shift mode and the functional mode.

All scan flip-flops share the same clock signal. And all scan flip-flops in the same scan chain are driven by the same scan enable signal, which is connected to the control signals of the multiplexers of the corresponding scan flip-flops in the same scan chain. Each scan flip-flop is driven by the preceding scan flip-flop in the scan chain. The first scan flip-flop of a scan chain is driven by the output of the phase shifter. Each scan flip-flop consists of one D flip-flop and a multiplexer. One input of the multiplexer is connected to the output of the preceding scan flip-flop, the other input of the multiplexer is connected to the predecessor of the scan flip-flop in the combinational part of the circuit. The output of the last scan flip-flop in the scan chain is a scan output of the circuit under test.

The logic to generate the weighted random signals that drive the scan enable signals of the scan chains. Two randomly selected pseudo-random signals are connected to a two input AND gate, whose output is connected to a two input OR gate. Another input of the OR gate is another randomly selected pseudo-random signals. All the pseudo-random signals are connected with the phase shifter directly. The output of the OR gate generates a signal with weight 0.625. Two randomly selected pseudo-random signals are connected to a two-input OR gate to generate a signal with weight 0.75. Three other randomly selected pseudo-random signals are connected to a third input OR gate to generate a signal with weight 0.875, the random signals with other weights can be generated in similar way. However, only the above three weights including the original pseudo-random signals with weight 0.5 are used in this invention.

The present invention further provides a scan-based self-test method using weighted scan-enable signals, the method is used in a self-test architecture comprising k scan chain $SC_1$, $SC_2$, ..., $SC_k$; wherein, supposing that $w^1=0.5$, $w^2=0.625$, $w^3=0.75$ and $w^4=0.875$ form a weight set $\overline{W}$; and a circuit testability evaluation function is established as follows:

$$G = \sum_{1/i \in F} \frac{|C_1(l) - C_0(l)|}{O(l)}$$

Wherein, F is a set of random hard-to-test faults, 1/i represents the single stuck-at-i fault on line l in the set of random hard-to-test faults F ($i \in \{0,1\}$), $C_1(l)$, $C_0(l)$ and $O(l)$ represent the 1--controllability, 0-controllability and observability of the signal line l, respectively;

the method comprising:

Step 1: set all the scan chains to a test-per-scan mode, and calculate testability of the circuit, function G ($w^0_1$) in this mode by the use of the above cost function, wherein the subscript 1 expresses the scan chain to be proceeded being a first chain $SC_1$, and the superscript 0 expresses that scan chain $SC_1$ is driven by the regular scan enable signal of the test-per-scan test scheme;

Step 2: while the other scan chains remaining in the test-per-scan mode, selecting the first scan chain $SC_1$, applying each of the weights in the weight set $\overline{W}$ to the scan enable signal of the first scan chain in the order of $w^1=0.5$, $w^2=0.625$, $w^3=0.75$ and $w^4=0.875$, so as to calculate the values of the testability evaluation function $G(w^1_1)$, $G(w^2_1)$, $G(w^3_1)$ and $G(w^4_1)$ corresponding to the weights $w^1$, $w^2$, $w^3$ and $w^4$, respectively;

Step 3: comparing $G(w^0_1)$, $G(w^2_1)$, $G(w^3_1)$ and $G(w^4_1)$ to find out a $G(w^v_1)$ for $v \in \{0,1,2,3,4\}$), such that $$G(w_1^v) = \min\{G(w_1^0)\ G(w_1^1)\ G(w_1^2)\ G(w_1^3)\ G(w_1^4)\}$$

When $v=0$, reserving $SC_1$ in the test-per-scan mode; when $v \neq 0$, assigning the weight $w^v$ to the scan-enable signal of $SC_1$, which is marked as $w^v_1$;

Step 4: introducing weighting information of the $SC_1$ enable signal of the first scan chain obtained in step 3 into said self-test structure, and updating the testability and the value of the testability evaluation function $G(w^0_2)$ of the circuit, where the subscript 2 represents the scan chain to be processed being the second scan chain, and the superscript 0 represents $SC_2$ being in the regular test-per-scan scan enable signal at this time;

Step 5: selecting the second scan chain $SC_2$, repeating steps 2 and 3 to obtain the weight $W^v_2$ corresponding to $SC_2$ enable signal, when $v=0$, reserving $SC_2$ in the test-per-scan mode; when $v \neq 0$, assigning the weight $w^v$ to the scan enable signal of $SC_2$; and updating the testability measure information on the circuit; and Step 6: representing the above steps for the remaining scan chains $SC_3$, ..., $SC_k$ to obtain the weights of the enable signals for all scan chains.

According to an embodiment of the self-test method of the present invention, the step 2 comprising:

step 2.1: assigning the weight $w^1=0.5$ to the first scan chain $SC_1$, which is represented by $w_1=w^1=0.5$, the subscript 1 of $w_1$ represents the scan chain to be processed being the first one, the superscript 1 of $w^1$ represents that the selected scan chain uses the first value 0.5 in the weight set, and remaining other scan chains $SC_2$ to $SC_k$ in the test-per-scan mode;

step 2.2: for all the scan chains $SC_2$ to $SC_K$ remaining in the test-per-scan mode, setting the 0-controllability $C_0$ and 1-controllability $C_1$ of all internal PPIs (pseudo-primary inputs) thereof to 0.5;

step 2.3: for the scan chain with weighted scan enable signal, i.e., the first scan chain, calculating the controllability of each signal line of each scan flip-flop in this chain, wherein the calculation scheme of the controllability of each scan flip-flop is the same, the calculation scheme of nth stage scan flip-flop is as follows:

$$C_1(PPI_n) = w_1 * C_1(a_{n-1}) + C_1(PPO_n)*(1-w_1)$$

$$C_1(a_{n-1}) = C_1(PPI_{n-1})$$

where $w_1$ represents the weight assigned to the scan enable signal corresponding to the first scan chain, $a_{n-1}$ represents the output signal line of (n-1)th scan flip-flop, $PPI_{n-1}$ represents the branch signal line connecting the output of (n-1)th scan flip-flop to the combinational part of the circuit, $PPI_n$ represents the branch signal line connecting the output of the nth scan flip-flop to the combinational part of the circuit, and $PPO_n$ (pseudo-primary output) represents the signal line connecting the combinational part of the circuit to the nth scan flip-flop;

$w_1*C_1(a_{n-1})$ represents, when the weight being $w_1$, the probability of $PPI_n$ being set to 1 in the scan mode, when n=1, $C_1(a_0)=0.5$; and $C_1(PPO_n) \cdot (1-w_1)$ represents, when the weight being $w_1$, the probability of $PPI_n$ being set to 1 in the functional mode;

Step 2.4: calculating the controllability of each node in the combinational part of the circuit, but use of following calculation formulas:

for the primary input P1 of the circuit, $$C_1(PI)=C_0(PI)=0.5$$

for the buffer gate, when A is its input and B is its output, $$C_1(B)=C_1(A), C_0(B)=C_0(A)$$

for the D flip-flop, when A is its input and B is its output, $$C_1(B)=C_1(A), C_0(B)=C_0(A)$$

for the NOT gate, when A is its input and B is its output, $$C_1(B)=C_0(A), C_0(B)=C_1(A)$$

for the j-input AND gate, when $A_1$ to $A_j$ are its inputs and B is its output, $$C_1(B) = \prod_{h=1}^{j} C_1(A_h), C_0(B) = 1 - C_1(B)$$

for the j-input OR gate, when $A_1$ to $A_j$ are its inputs and B is its output, $$C_0(B) = \prod_{h=1}^{j} C_0(A_h), C_1(B) = 1 - C_0(B)$$

for the j-input NAND gate, when $A_1$ to $A_j$ are its inputs, and B is its output, $$C_0(B) = \prod_{h=1}^{j} C_1(A_h), C_1(B) = 1 - C_0(B)$$

for the j-input NOR gate, when $A_1$ to $A_j$ are its inputs and B is its output, $$C_1(B) = \prod_{h=1}^{j} C_0(A_h), C_0(B) = 1 - C_1(B)$$

step 2.5: for all the scan chains $SC_2$ to $SC_k$ remaining in the test-per-scan mode, setting the observabilities O of all its internal PPO's to $1/(m+1)$, wherein m is the number of the scan flip-flops included in this scan chain;

step 2.6: for the weighted scan chain i.e., the first scan chain, calculating the observability of each signal line of each of the scan flip-flops in this chain in the order of the last stage to the first stage, the calculation schemes of the observability of the scan flip-flop of all stages being the same, and the observability of a nth stage scan flip-flop is calculated by use of the following formula:

$$O(\alpha_{n-1})=1-(1-O(PPI_{n-1}))*(1-O(b_{n-1}))$$

$$O(b_{n-1})=w_1*O(\alpha_n)$$

$$O(PPO_n)=O(\alpha_n)*(1-w_1);$$

wherein, the definitions on $w_1 \rightarrow \alpha_{n-1} \rightarrow PPI_{n-1}$ and $PPO_n$ are the same as stated above, and $b_{n-1}$ represents a node connecting the output of the (n-1)th scan flip-flop to the input of the nth scan flip-flop, when n=m, i.e., the nth scan flip-flop (the last scan flip-flop in the scan chain), then $O(dn)=1$;

step 2.7: calculating the observability of all nodes in the combinational part of the circuit, by use of following calculation formulas:

for each primary output PO of the circuit, $$O(PO)=1$$

for a buffer gate with input A and output B, $$O(A)=O(B)$$

for a D flip-flop with input A and output B, $$O(A)=O(B)$$

for a NOT gate with input A and out out B, $$O(A)=O(B)$$

for the j-input AND gate with inputs form $A_1$ to $A_j$ and output B, $$O(A_q) = O(B) * \prod_{\substack{1 \le h \le j \\ h \ne q}} C_1(A_h)$$

for the j-input OR gate with inputs $A_1$ to $A_j$ and output B, $$O(A_q) = O(B) * \prod_{\substack{1 \le h \le j \\ h \ne q}} C_0(A_h)$$

for the j-input NOT-AND gate with inputs from $A_1$ to $A_j$ and output B, $$O(A_q) = O(B) * \prod_{\substack{1 \le h \le j \\ h \ne q}} C_1(A_h)$$

for the j-input NOR gate with inputs from $A_1$ to $A_j$ and output B, $$O(A_q) = O(B) * \prod_{\substack{1 \le h \le j \\ h \ne q}} C_0(A_h)$$

step 2.8: calculating the function value $G(w_1^1)$ corresponding to the first weight $w^1$ in the weight set $\overline{W}$ by the use of the testability gain function, wherein the testability gain function value being calculated by use of the following formula:

$$G = \sum_{1/i \in F} \frac{|C_1(l) - C_0(l)|}{O(l)}$$

the definitions on the symbols in this formula being the same as stated above; and step 2.9: for other weight $w^2$, $w^3$ and $w^4$ in the weight set $\overline{W}$, repeating the steps 2.1 to 2.8, respectively, so as to calculate the testability gain function values $G(w_1^2)$, $G(w_1^3)$, $G(w_1^4)$ corresponding to $w^2$, $w^3$ and $w^4$, respectively.

The present invention combines the scan-based self-test technique and the weighted random test technique, and achieves the objective of the generation of weighted random test vectors by using weighted enable signals. This strategy has the advantage that test responses at any clock can be collected, and easily implemented, where any four extra gates are sufficient to implement the weighted scan enable signal based scan-based BIST scheme. Further, the implementation of this technique does not need to modify the hardware of the existing self-test architectures, general purpose pseudo-random test pattern generators and test response compactor are suitable for the present invention.

This invention provides a novel scan-based self-test architecture and method using weighted scan enable signals. The test-per-scan BIST technique can be used for testability design of digital circuits, and the method to implement the circuit structure can further be used as a standard EDA algorithm and can easily be embedded into various EDA software popularly used in the technical field.

BRIEF DESCRIPTION OF FIGURES

FIG. 6.1 circuit s3330;
FIG. 6.2 circuit s15850.1;
FIG. 6.3 circuit s38584;
and FIG. 6.4 circuit b20.

DETAILED DESCRIPTION OF PREFERRED EMBODIMENTS

Figure 1:
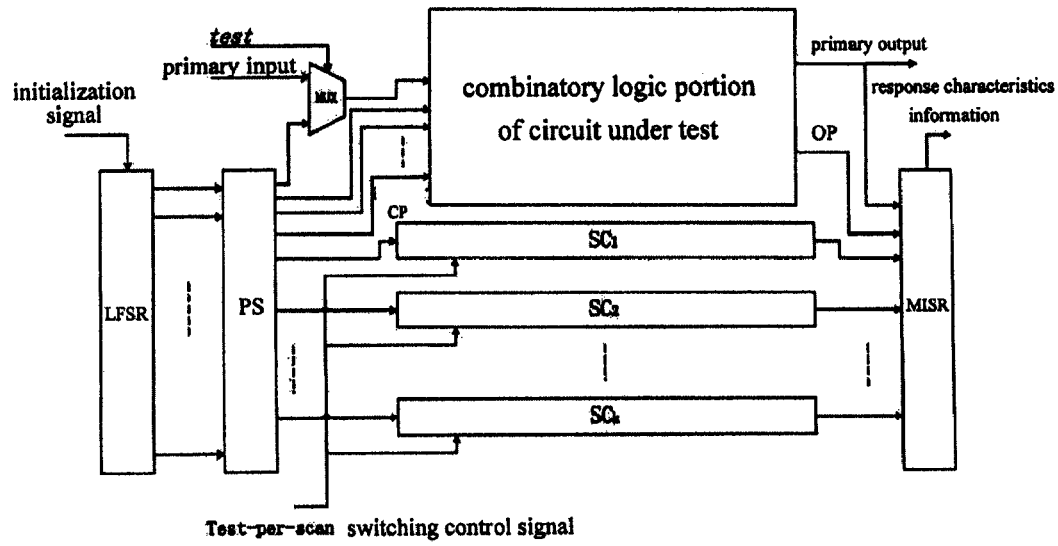
FIG. 1 illustrates a test-per-scan self-test architecture.
Figure 2:
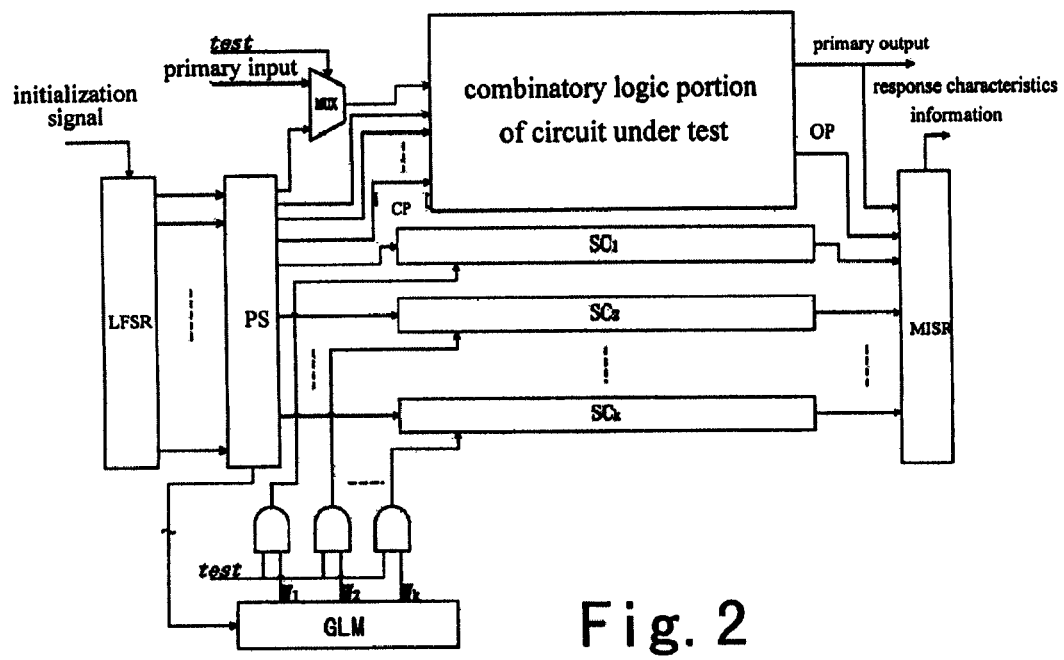
FIG. 2 illustrates a self-test architecture using weighted scan enable signals.

FIG. 2 shows a basic block diagram of the circuit structure according to an embodiment of the present invention. Weights $w_1, w_2, \ldots, w_k \in \{0.5, 0.625, 0.75, 0.85\}$ are assigned to scan enable signals of scan chains $SC_1, SC_2, \ldots, SC_k$ respectively. MUX represents a multiplexer. The selected weights are connected to the scan enable signals of the scan chains through k AND gate. One input of each AND gate is a switch signal for switching between a test mode and a normal operation mode, which is marked as test. When test=1, the system is in the test mode, and weighted scan enable signals are applied to the scan chains to generate weighted test pattern; when test=0, the system turns to the normal operation mode.

It is essential to select appropriate weights for the scan chains as shown in FIG. 2. This may affect final test results of the circuit. The present embodiment provides an algorithm and a circuit testability gain function. Selection of weights assigned to the scan enable signals of the scan chains is to minimize the cost gain function. The testability gain function is estimated as follows:

$$G = \sum_{l/i \in F} \frac{|C_1(l) - C_0(l)|}{O(l)} \quad (1)$$

In the equation (1), F is a set of random hard-to-test faults, 1/i represents a single stuck-at-i fault ($i \in \{0,1\}$) in the set of random hard-to-test faults F on node 1, and $C_1(1)$, $C_0(1)$ and O(1) represent the 1-controllability, 0-controllability and observability of 1, respectively. Therefore, for each of the scan chains, it is desirable to select an element from the set S={0.5, 0.625, 0.75, 0.875} as the weight of the scan chain, which obtains the minimum cost gain.

The details of the method for selecting a weight for each scan chain is described as follows. Assuming that a scan design circuit contains k scan chains $SC_1, SC_2, \ldots, SC_k$, and the set of weights S comprises weights $w^1=0.5$, $w^2=0.625$, $w^3=0.75$, and $w^4=0.875$. Here $w^0$ represents that a scan chain is assigned a regular scan enable signal as that used in the test-per-scan test scheme. The method can be described as follows:

Method for Selecting Corresponding Weight for the Enable Signal of Each Scan Chain 7. Set the enable signals of all the scan chains to the same as that of the traditional test-per-scan test scheme, and calculate the testability cost gain function $G(w^0_1)$ as presented in Equation (1) (the subscript 1 represents that the scan chain to be processed is the first chain $SC_1$; and the superscript 0 represents that $SC_1$ is assigned the scan enable signal as that of the traditional test-per-scan test scheme at that time).
8. Selecting the first scan chain $SC_1$, applying each of the weights $w^1$, $w^2$, $w^3$ and $w^4$ in the set of weights F on the scan chain in this order (while other scan chains remain as the traditional test-per-scan mode) to calculate circuit testability evaluation functions values $G(w^1_1)$, $G(w^2_1)$, $G(w^3_1)$ and $G(w^4_1)$ corresponding to $w^1$, $w^2$, $w^3$ and $w^4$ respectively.
9. Comparing $G(w^0_1)$, $G(w^1_1)$, $G(w^2_1)$, $G(w^3_1)$, and $G(w^4_1)$ to find out $G(w^v_1)=\min\{G(w^0_1), G(w^1_1), G(w^2_1), G(w^3_1), G(w^4_1)\}$. If v=0, $SC_1$ is kept in the traditional test-per-scan mode; if v≠0, then the weight $w^v$ is assigned to the scan enable signal of $SC_1$ and is marked as $w^v_1$.
10. Introducing the weighted information $w^v_1$ of the $SC_1$ enable signal into the circuit (if v=0, $SC_1$ is kept in the traditional test-per-scan mode), and updating the testability measure of the circuit and the testability cost gain function value $G(w^0_2)$ (the subscript 2 represents that the scan chain to be processed is the second one $SC_2$, and the superscript 0 represents that $SC_2$ still remains in status as that of the traditional test-per-scan test scheme at the time).
11. Selecting second scan chain $SC_2$, and repeating steps 2 and 3 to obtain the weight $w^v_2$ corresponding to the $SC_2$ enable signal (if v=0, then $SC_2$ is kept in the traditional test-per-scan mode). $w^v_2$ is applied to the circuit and the testability measure information is updated.
12. For the remaining scan chains $SC_3, \ldots, SC_k$, repeating the above-mentioned steps to thereby obtain the weights of these scan enable signals of all the scan chains, respectively.

In the above-mentioned method for selecting a weight for each scan chain, the calculation of the testability cost gain function G is based on the accurate evaluation of the testability measure parameters (controllability and observability) on internal signal lines (nodes) of the circuit. The testability measures of the internal nodes in the circuit is calculated by using the COP (controllability and observability calculation program) testability measure. The details of the measure calculation will be explained in the following.

Figure 3:
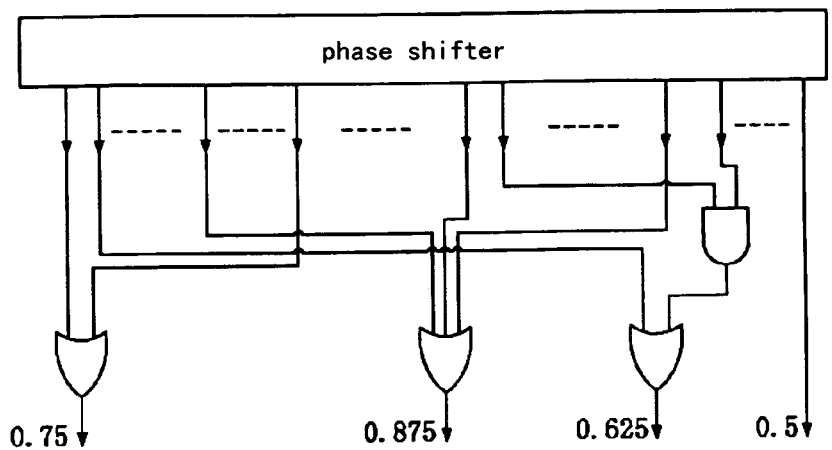
FIG. 3 illustrates the extra logic of the weighted random scan enable signals.

The present embodiment further defines a generation logic module (GLM) of the weighted scan enable signals as shown in FIG. 2, which is the hardware structure for generating the weighted scan enable signal, the specific structure thereof is shown in FIG. 3. The phase shifter generates pseudo-random (may be regarded as the weight 0.5) random signal. Two outputs of the phase shifter (PS) is connected to a two input AND gate, whose output is connected to a two input OR gate, and the other input of the OR gate is an output of the phase shifter. The output of the two-input OR gate generates $w^2$ (0.625); a two-input OR gate generates $w^3$ (0.75), whose inputs are connected to the phase shifter; a three-input OR gate generates $w^4$ (0.875) at its output, whose inputs are connected the phase shifter. Scan chains with the same weight can share the same scan enable signal, which makes extra overhead to generate the three weights be very low.

To implement the above-mentioned method for selecting a weight for each scan chain, it is necessary to calculate testability measures (including two controllability measure and the observability measure) for each node in the circuit. The present invention provides a new testability calculation method. In a specific calculation procedure, the 0/1 controllabilities of the primary input (abbreviated to PI) and the output of the scan flip-flop (it may also be called pseudo-primary input, and abbreviated to PPI, since the function thereof in test mode is equivalent to that of the primary input) are estimated first. The observability of a primary output abbreviated to PO) and the input of a scan flip-flop (it may also be called pseudo-primary output, and abbreviated to PPO, since the function thereof in test mode is equivalent to that of a primary output) can also be calculated first. The controllability and observability of all nodes in the circuit are estimated based on the COP measure. The calculation procedure of the invention differs from those of traditional methods mainly by the determination of two sets of boundary conditions, i.e., the controllability and the observability on the scan chains (including PPI and PPO).

For scan chains (remaining in the traditional test-per-scan mode), it may be regarded that the 0-controllabilities and 1-controllabilities of all the internal PPIs thereof are 0.5; and the observabilities of all internal PPOs thereof are 1/(1+1), where 1 is the number of scan flip-flops contained in this scan chain. Although they are estimated values, however, they are sufficiently accurate, and the complexity of the testability measure calculations of the internal nodes can be greatly simplified. For the weighted enabling scan chains, the controllability calculation of the internal PPIs and the observability calculation of the internal PPOs will be described as follows. A circuit may have a number of scan chains with weighted scan enable signals, the calculation method will be explained here by taking one scan chain as an example).

Figure 4:
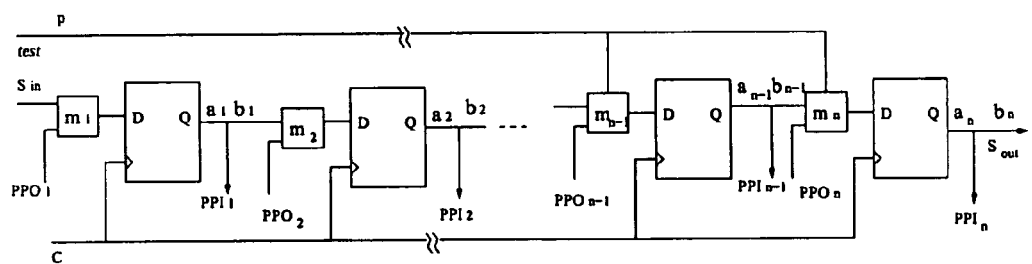
FIG. 4 illustrates a scan chain with weighted scan enable signals.

The Controllability Calculation of PPI in a Scan Chain with Weighted Scan Enable Signal FIG. 4 presents a scan chain of length n (referring to a scan chain SC in FIG. 2), the weight W is assigned to its scan enable signal. In the figure, $M_n$ represents the multiplexer of the nth scan flip-flop, which forms a scan flip-flop together with a D flip-flop, and n scan flip-flops connect together to form a scan chain. $PPI_n$ and $PPO_n$ represents the output (also the pseudo-input of circuit) and input (also the pseudo-output of the circuit) of the nth scan flip-flop, respectively.

The signal probability of $PPI_1$ (1-controllability) can be expressed by:

$$C_1(PPI_1) = \frac{1}{2} \cdot w + C_1(PPO_1) \cdot (1-w) \quad (2)$$

In Equation (2), $$\frac{1}{2} \cdot w$$

represents the probability for PPI being set to 1 by the pseudo-random scan input signal $S_{in}$ in the test mode; and $C_1(PPO_1) \cdot (1-w)$ represents the probability for $PPI_1$ being set to 1 by the input $PPO_1$ of the same scan flip-flop in the functional mode (response collecting period). The signal probability of $PPI_2$ (1-controllability) can be expressed by:

$$C_1(PPI_2) = w \cdot C_1(\alpha_1) + C_1(PPO_2) \cdot (1-w) \quad (3)$$

In Equation (3), $w \cdot C_1(\alpha_1)$ represents the probability for $PPI_2$ being set to 1 in the test mode, where $C_1(a_1) = C_1(PPI_1)$; and $C_1(PPO_2) \cdot (1-w)$ represents the probability for $PPI_2$ being set to 1 by the input $PPO_2$ of the same scan flip-flop in the functional mode (response collecting period). The signal probability of $PPI_n$ (1-controllability) can be calculated as follow:

$$C_1(PPI_n) = w \cdot C_1(\alpha_{n-1}) + C_1(PPO_n) \cdot (1-w) \quad (4)$$

In Equation (4), $C_1(\alpha_{n-1}) = C_1(PPI_{n-1})$.

For the nodes in the combinational part of the circuit, the controllability calculation scheme is the same as that of the traditional test-per-scan self-test scheme using the COP measure.

The Observability Calculation of the PPO in a Scan Chain with Weighted Scan Enable Signal For a scan with a weighted scan enable signal, observability calculation is started from the scan-out signal.

First, consider the $n^{th}$ scan flip-flop, $$O(\alpha_{n-1}) = 1 - (1 - O(PPI_{n-1})) \cdot (1 - O(b_{n-1})) \quad (5)$$

$$O(b_{n-1}) = w \cdot O(\alpha_n) = w \quad (6)$$

$$O(PPOn) = O(an) \cdot (1-w) = 1-w \quad (7)$$

The Equation (5) indicates that the fault effect at $a_{n-1}$ may be propagated through two paths $b_{n-1}$ and $PPI_{n-1}$, respectively, at a certain probability.

The Equation (6) expresses the probability for the fault effect at $b_{n-1}$ to be propagated to the scan-out signal through $a_n$ in the test mode. The Equation (7) expresses the probability for the fault effect at $PPO_n$ to be propagated to the scan-out signal through $a_n$ in the function mode. Observability calculation of related nodes of the second scan flip-flop is as follows:

$$O(\alpha_2) = 1 - (1 - O(PPI_2)) \cdot (1 - O(b_2)) \quad (8)$$

$$O(b_2) = w \cdot O(\alpha_3) \quad (9)$$

$$O(PPO_2) = O(\alpha_2) \cdot (1-w) \quad (10)$$

Similarly, the observability of related signals of the first scan flip-flop is calculated as follows:

$$O(\alpha_1) = 1 - (1 - O(PPI_1)) \cdot (1 - O(b_1)) \quad (11)$$

$$O(b_1) = w \cdot O(\alpha_2) \quad (12)$$

$$O(PPO_1) = O(\alpha_1) \cdot (1-w) \quad (13)$$

Figure 5:
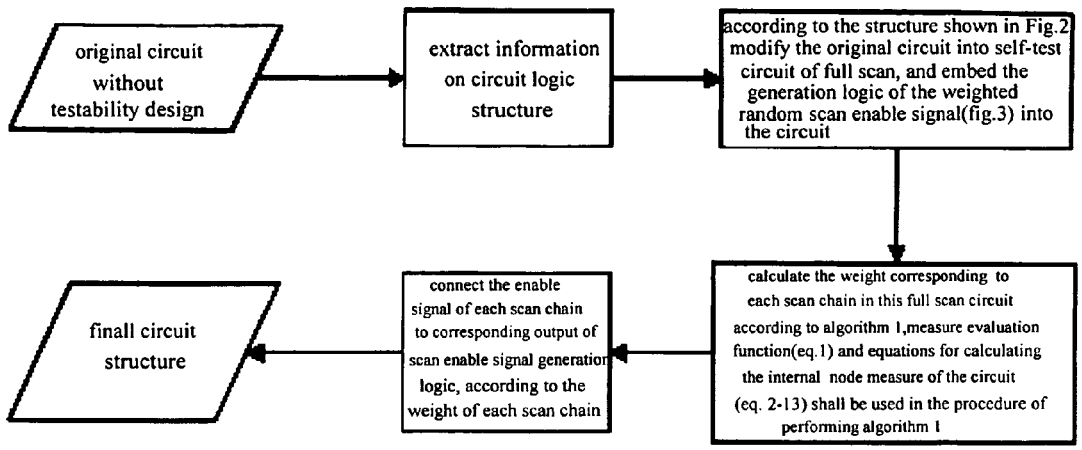
FIG. 5 illustrates a general flowchart of an embodiment according to the method of the present invention.

The Equations (2)-(13) are used to calculate controllability and observability of all PPIs and PPOs in the scan chains with weighted scan enable signals. These equations also reflect interdependence of the PPIs and PPOs on the combinational part of the circuit in the testability measure calculation. Therefore, it is impossible to determine testability measures of all PPIs and PPOs once. In this invention for calculating testability measure, first, an initial measure value is set for all PPIs and PPOs, accurate measure values of which can not be determined according to the above mentioned rules on the scan chains and the COP measures in the combinational part of the circuit. A calculation is completed by using an iterative method. It has been proved by experiments that final results based on the iterative method is insensitive to the initial values, and the final results converge rapidly. FIG. 5 illustrates the general flowchart of the invention.

The invention provides an effective scan-based self-test method. In the method, a new pseudo-random test pattern generation scheme is proposed by using weighted scan enable signals, and thereby weighted test signals are generated at PPIs, and test responses are randomly collected during the test procedure. In the invention, any extra logic does not need to be inserted into functional paths of the circuit, and only four extra gates is necessary to be inserted in order to generate the weights assigned to scan enable signals of the scan chains. In the present invention, the number of scan shift cycles and the number of capture cycles of a test cycle are not fixed. The present invention has fully jumped out of the framework of the traditional test-per-scan self-test method. The method of the present invention can easily be embedded into the existing EDA tools. Sufficient experimental results show that the new invention can significantly improve the test effectiveness of scan-based BIST.

Experimental results for the ISCAS 89, 93 and ITC 99 circuits are presented by comparing with two recent methods. In the self-test structure, a combination of a 24-stage linear feedback shift register (LFSR) and a phase shifter is used as the pseudo-random test pattern generator. The length of all scan chains is set to 10, and the fault simulation time is set to 500,000 clock cycles.

The two methods compared with the invention: The test-per-scan test scheme with multiple capture cycles (MTS, proposed by Kwang-ting Cheng in UCSB) and the traditional test-per-scan method (STS). Both methods uses the phase shifter presented by Rajski et al. in the Mentor Graphics. Comparison of the method (WTS) of the present invention with both methods in presented in Table 1.

The sixth column presents CPU time to select weights according to the method in the present invention.

Columns 7 to 9 present fault coverage (FC) of the three methods. The invention obtains better fault coverage for all circuits. As for circuit s4863, the invention achieves 100% fault coverage, and it gets over 99% fault coverage for circuits s1269, s1423, s3271 and s5378; all other circuits also get fault coverage close to 100%. The experimental results show that the two methods of the present invention and MTS are obviously better than STS. Further, for all circuits, the invention obtains better fault coverage that that obtained by the MTS. The invention gets apparently better fault coverage than MTS for circuits s3330, s9234, s13207.1, b20, s15850 and s15850.1

Columns 10 to 15 present fault coverage three methods WTS, MTS and STS after the insertion of test points. Only comparison for the hard-to-test circuits is presented. The numbers of test points (#tp) used in the three methods are equal. The experimental results show that fault coverage of the hard-to test circuits can be very close to 100% by the WTS method after inserting some test points.

Figure 6:
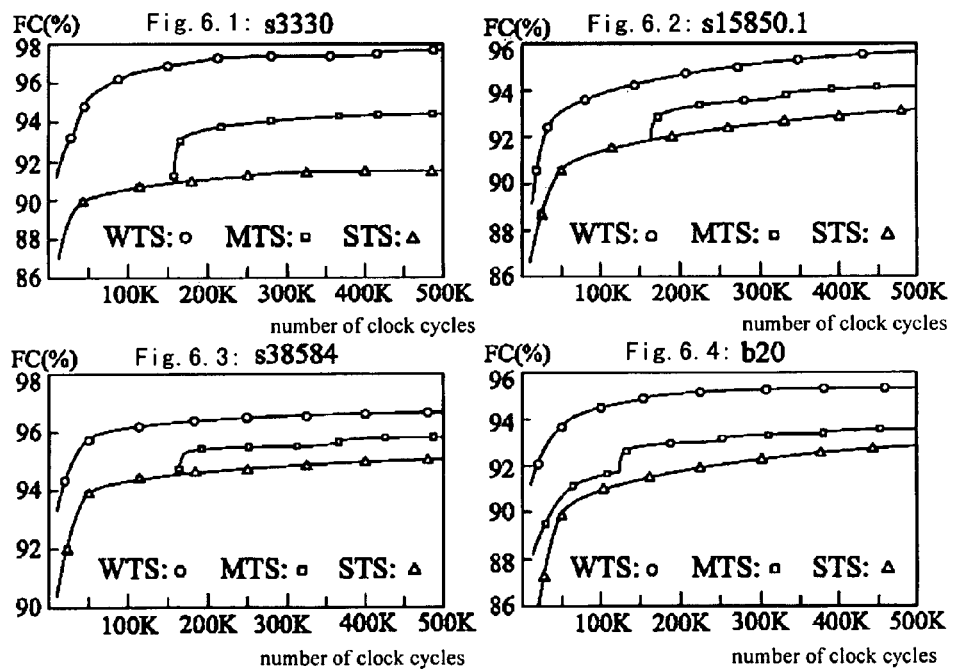
FIG. 6 illustrates fault coverage curves.

FIG. 6 presents fault coverage curves of the three methods with various clock cycles. The four representative circuits s3330 s15850.1, s38584 and b20 are selected. WTS obtains better fault coverage in all cases. The WTS scheme can obtain the expected fault coverage earlier for all circuits.

What is claimed is:

1. A scan-based self-test method using weighted scan-enable signals, said method is used in a self-test architecture comprising k scan chains $SC_1, SC_2, \ldots, SC_k$; wherein k is an integer greater than or equal to 2; wherein, $w^1=0.5, w^2=0.625, w^3=0.75$ and $w^4=0.875$ form a weight set $\overline{W}$; and a circuit testability gain function is established as follows:

TABLE 1

Comparison of Experimental Results

| circuit | area (orig.) | area (PS) | area (WG) | AO (%) | CPU Time (sec) | FC (%) without test point | | | FC (%) after inserting test points | | | | | |
|---|---|---|---|---|---|---|---|---|---|---|---|---|---|---|
| | | | | | | | | | WTS | | MTS | | STS | |
| | | | | | | WTS | MTS | STS | #tp | FC (%) | #tp | FC (%) | #tp | FC (%) |
| s1269 | 1417 | 168 | 9 | 12.46 | 0.10 | 99.87 | 98.99 | 98.99 | — | — | — | — | — | — |
| s1423 | 1904 | 192 | 9 | 10.56 | 0.28 | 99.25 | 98.95 | 98.30 | — | — | — | — | — | — |
| s1512 | 1834 | 272 | 9 | 15.32 | 0.22 | 96.92 | 96.86 | 96.28 | 5 | 98.33 | 5 | 97.88 | 5 | 97.29 |
| s3271 | 3859 | 292 | 9 | 7.80 | 1.35 | 99.95 | 99.57 | 98.25 | — | — | — | — | — | — |
| s3330 | 4136 | 412 | 9 | 10.18 | 1.16 | 97.58 | 94.33 | 91.51 | 5 | 99.57 | 5 | 98.40 | 5 | 97.73 |
| s3384 | 4619 | 472 | 9 | 10.41 | 1.62 | 97.65 | 97.62 | 96.36 | 5 | 98.25 | 5 | 97.65 | 5 | 97.47 |
| s4863 | 5123 | 456 | 9 | 9.06 | 1.41 | 100 | 99.25 | 97.54 | — | — | — | — | — | — |
| s5378 | 6002 | 404 | 9 | 6.88 | 2.23 | 99.30 | 98.93 | 98.18 | — | — | — | — | — | — |
| s9234 | 10207 | 320 | 9 | 3.22 | 12.43 | 91.88 | 90.70 | 88.02 | 20 | 93.65 | 20 | 93.61 | 20 | 92.50 |
| s13207.1 | 17687 | 972 | 9 | 5.55 | 48.64 | 98.55 | 97.31 | 97.31 | — | — | — | — | — | — |
| s15850 | 19643 | 564 | 9 | 2.92 | 43.16 | 95.01 | 93.86 | 93.64 | 15 | 97.32 | 15 | 96.51 | 15 | 96.19 |
| s15850.1 | 19011 | 1012 | 9 | 5.37 | 56.86 | 95.42 | 94.12 | 93.48 | 15 | 97.51 | 15 | 96.58 | 15 | 96.28 |
| s38417 | 48824 | 1480 | 9 | 3.05 | 573.0 | 98.24 | 97.06 | 95.85 | 15 | 99.26 | 15 | 98.86 | 15 | 98.05 |
| s38584 | 47584 | 1216 | 9 | 2.57 | 472.2 | 96.33 | 95.91 | 95.46 | 13 | 97.34 | 13 | 97.12 | 13 | 96.83 |
| b14 | 21323 | 432 | 9 | 2.07 | 25.3 | 92.12 | 91.49 | 89.93 | 15 | 94.65 | 15 | 94.17 | 15 | 92.69 |
| b20 | 43003 | 628 | 9 | 1.48 | 161.1 | 95.41 | 94.00 | 93.28 | 20 | 96.60 | 20 | 95.52 | 20 | 94.15 |
| b21 | 43811 | 628 | 9 | 1.45 | 162.4 | 93.39 | 93.01 | 91.83 | 20 | 96.44 | 20 | 95.64 | 20 | 94.79 |
| b22 | 63957 | 628 | 9 | 1.25 | 347.9 | 94.99 | 94.37 | 93.54 | 20 | 96.90 | 20 | 95.71 | 20 | 94.68 |
| Ave. | — | — | — | — | — | 96.72 | 95.91 | 94.88 | — | 97.14 | — | 96.47 | — | 95.72 |

In the Table 1, Columns 2 to 5 present the area of the original circuit (area(orig.)), the area of the phase shifters (area(PS)) used in the method of the present invention, the area of the logic to generate the weights in FIG. 3 (area (WG)), and the percentages (AO) total area overhead of the invention. Note that the area overhead to generate the weights is very small and does not vary with the scale of the circuit.

$$G = \sum_{l/i \in F} \frac{|C_1(l) - C_0(l)|}{O(l)}$$

where F is a set of random hard-to-test faults, 1/i represents single stuck-at-i fault on the signal line l in the set of random hard-to-test faults F (i∈{0,1}), $C_1(1)$, $C_0(1)$ and $O(1)$ represent the 1-controllability, 0-controllability and observability on the signal line l, respectively;

the method comprising:

generating pseudo-random test vector signals;

randomly selecting the pseudo-random test vector signals;

generating weights of the enable signals for all the scan chains, comprising:

Step 1: initially set the scan enable signals of all the scan chains as that of test-per-scan mode, and calculating the circuit testability gain function $G(w^0{}_1)$ in this mode by the use of the above formula, wherein the subscript 1 expresses the scan chain to be processed being a first chain $SC_1$, and the superscript 0 expresses $SC_1$ being set the regular test-per-scan state;

Step 2: while the other scan chains remaining in the test-per-scan mode, selecting the first scan chain $SC_1$, applying to the first scan chain each of the weights in the weight set $\overline{W}$ in the order of $w^1=0.5$, $w^2=0.625$, $w^3=0.75$ and $w^4=0.875$, so as to calculate the values of the testability gain function $G(w^1{}_1)$, $G(w^2{}_1)$, $G(w^3{}_1)$ and $G(w^4{}_1)$ corresponding to the weights $w^1$, $w^2$, $w^3$ and $w^4$, respectively;

Step 3: comparing $G(w^0{}_1)$, $G(w^1{}_1)$, $G(w^2{}_1)$, $G(w^3{}_1)$ and $G(w^4{}_1)$ to find out a $G(w^v{}_1)$, such that $$G(w_1^v)=\min\{G(w_1^0),\ G(w_1^1),\ G(w_1^2),\ G(w_1^3),\ G(w_1^4)\};$$

When v=0, reserving $SC_1$ in the test-per-scan mode; when v≠0, assigning the weight $w^v$ to the scan-enable signal of $SC_1$, which is marked as $w^v{}_1$ where v∈{0, 1, 2, 3, 4};

Step 4: assigning the selected weight of the enable signal of the first scan chain $SC_1$, and updating the testability measure information and the value of the testability gain function $G(w_2^0)$ of the circuit, where the subscript 2 represents the scan chain to be processed being the second scan chain, and the superscript 0 represents $SC_2$ being set as the regular test-per-scan state;

Step 5: selecting the second scan chain $SC_2$, repeating steps 2 and 3 to obtain the weight $w^v{}_2$ for the scan enable signal of $SC_2$, when v=0, reserving the selected weight of $SC_2$ in the test-per-scan mode; when v≠0, assigning the weight $w^v$ to the scan enable signal of $SC_2$; and updating the testability measure information on the circuit; and Step 6: repeating the above steps for the remaining scan chains $SC_3, \ldots, SC_k$ to obtain the weights of the enable signals for all the scan chains;

the method further comprising:

receiving weighted scan enable signals of the scan chains and controlling the switching of the scan chains between a scan mode and a functional mode; and assigning weighted pseudo-random test vector signals to all pseudo-primary inputs (PPIs) of scan flip-flops in the circuit based on the obtained weights of the scan enable signals.

2. The self-test method according to claim 1 wherein the step 2 comprising:

step 2.1: assigning the weight $w^1=0.5$ to the first scan chain $SC_1$, which is represented by $w_1=w^1=0.5$, the superscript 1 of $w_1$ represents the scan chain to be processed being the first one, the superscript 1 of $w^1$ represents that the selected scan chain uses the first value 0.5 in the weight set, and the remaining other scan chains $SC_2$ to $SC_k$ are in the test-per-scan mode;

step 2.2: for all the scan chains $SC_2$ to $SC_k$ remaining in the test-per-scan mode, setting the 0-controllability $C_0$ and 1-controllability $C_1$ of all internal PPI's (pseudo-primary inputs) thereof to 0.5;

step 2.3: for the weighted scan chain, i.e., the first scan chain, calculating the controllability of each node of each scan flip-flop in this chain from the first scan flip-flop to the last one, wherein the calculation scheme of the controllability of each scan flip-flop is the same, the calculation scheme of the nth scan flip-flop as follows:

$$C_1(PPI_n)=w_1C_1(a_{n-1})+C_1(PPO_n)*(1-w_1)$$

$$C_1(a_{n-1})=C_1(PPI_{n-1})$$

where $w_1$ represents the weight corresponding to the first scan chain, $\alpha_{n-1}$ represents the output signal line of (n-1)th stage scan flip-flop, $PPI_{n-1}$ represents the fanout branch connecting the output terminal of the (n-1)th scan flip-flop to the combinational part of the circuit, $PPI_n$ represents the fanout branch connecting the output of the nth scan flip-flop to the combinational part of the circuit, and $PPO_n$ represents the data input of the nth scan flip-flop, which is the output from the combinational part of the circuit feeding to the scan flip-flop;

$w_1*C_1 (\alpha_{n-1})$ represents, when the weight being $w_1$, the probability of $PPI_n$ being set to 1 in the scan mode, when n32 1, $C_1(\alpha_0)=0.5$; and $C_1(PPO_n)\cdot(1-w_1)$ represents, when the weight being $w_1$, the probability of $PPI_n$ being set to 1 in the functional mode;

Step 2.4: calculating the controllability of each node in the combinational part of the circuit, by use of following calculation formulas:

for a primary input terminal PI of the circuit, $$C_1(PI)=C_0(PI)=0.5$$

for a buffer gate, when A is its input and B is its output, $$C_1(B)=C_1(A),\ C_0(B)=C_0(A)$$

for a D flip-flop with input A and output B, $$C_1(B)=C_1(A),\ C_0(B)=C_0(A)$$

for an NOT gate B with input A, $$C_1(B)=C_0(A),\ C_0(B)=C_1(A)$$

for a j-input AND gate with inputs from $A_1$ to $A_j$ and output B, $$C_1(B)=\prod_{h=1}^{j} C_1(A_h),\ C_0(B)=1-C_1(B)$$

for a j-input OR gate with inputs from $A_1$ to $A_j$ and output B, $$C_0(B)=\prod_{h=1}^{j} C_0(A_h),\ C_1(B)=1-C_0(B)$$

for a j-input NAND gate with input from $A_1$ to $A_j$ and output B, $$C_0(B) = \prod_{h=1}^{j} C_1(A_h), \ C_1(B) = 1 - C_0(B)$$

for a j-input NOR gate with inputs from $A_1$ to $A_j$ and output B, $$C_1(B) = \prod_{h=1}^{j} C_0(A_h), \ C_0(B) = 1 - C_1(B)$$

step 2.5: for all the scan chains from $SC_2$ to $SC_k$ remaining in the test-per-scan mode, setting the observabilities O of all its internal pseudo-primary outputs (PPOs) to $1/(m+1)$, wherein m is the number of scan flip-flops included in this scan chain;

step 2.6: for the weighted scan chain i.e., the first scan chain, calculating the observability of each signal line of each of the scan flip-flops in this chain in the order of the last scan flip-flop to the first scan flip-flop, the calculation schemes of the observability for all scan flip-flop are the same, and the observability of the nth scan flip-flop is calculated by use of the following formula:

$O(\alpha_{n-1}) = 1 - (1 - O(PPI_{n-1})) * (1 - O(b_{n-1}))$ $O(b_{n-1}) = w_1 * O(\alpha_n)$ $O(PPO_n) = O(\alpha_n)(1 - w_1);$ wherein, the definitions of $w_1$, $\alpha_1$, $\alpha_n$, $PPI_{n-1}$ and $PPO_n$ are the same as stated above, and $b_{n-1}$ represents the node connecting the output of the (n-1)th scan flip-flop to the input of the nth scan flip-flop, when n=m, i.e., the last scan flip-flop, then $O(a_n)=1$;

step 2.7: calculating observability of all nodes in the combinational part of the circuit, by use of following calculation formulas:

for the primary output PO of the circuit, $O(PO)=1$ for the buffer gate B with input A, $O(A)=O(B)$ for the D flip-flop B with input A, $O(A)=O(B)$ for the NOT gate B with input A, $O(A)=O(B)$ for the j-input AND gate B with inputs from $A_1$ to $A_j$, $$O(A_q) = O(B) * \prod_{\substack{1 \leq h \leq j \\ h \neq q}} C_1(A_h)$$

for the j-input OR gate B with inputs from $A_1$ to $A_j$, $$O(A_q) = O(B) * \prod_{\substack{1 \leq h \leq j \\ h \neq q}} C_0(A_h)$$

for the j-input NAND gate B with inputs from $A_1$ to $A_j$, $$O(A_q) = O(B) * \prod_{\substack{1 \leq h \leq j \\ h \neq q}} C_1(A_h)$$

for the j-input NOR gate B with inputs from $A_1$ to $A_j$, $$O(A_q) = O(B) * \prod_{\substack{1 \leq h \leq j \\ h \neq q}} C_0(A_h)$$

step 2.8: calculating the gain function $G(w_1^1)$ corresponding to the first weight $w^1$ in the weight set $\overline{W}$ based on the gain function as follows, $$G = \sum_{l/i \in F} \frac{|C_1(l) - C_0(l)|}{O(l)}$$

the definitions on the symbols in this formula being the same as stated above; and step 2.9: for other weight $w^2$, $w^3$ and $w^4$ in the weight set $\overline{W}$, repeating the steps 2.1 to 2.8, so as to calculate the gain functions $G(w_1^2)$, $G(w_1^3)$ and $G(w_1^4)$ corresponding to $w^2$, $w^3$ and $w^4$, respectively.

* * * * *